(12) United States Patent
Otaka

(10) Patent No.: US 6,215,989 B1
(45) Date of Patent: Apr. 10, 2001

(54) VARIABLE GAIN CIRCUIT

(75) Inventor: Shoji Otaka, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/471,493

(22) Filed: Dec. 23, 1999

(30) Foreign Application Priority Data

Dec. 25, 1998 (JP) .................................. 10-370290

(51) Int. Cl.$^7$ .................................................. H04B 1/06
(52) U.S. Cl. ...................... 455/234.1; 330/254; 330/278
(58) Field of Search ........................ 455/232.1, 234.1, 455/234.2, 246.1, 251.1, 253.2; 330/252, 254, 257, 278, 288

(56) References Cited

U.S. PATENT DOCUMENTS

| | | | |
|---|---|---|---|
| 4,168,472 | * 9/1979 | Sugimoto | 455/234.1 |
| 4,339,728 | * 7/1982 | Monticelli | 455/234.1 |
| 5,900,782 | * 5/1999 | Igarashi et al. | 330/254 |

OTHER PUBLICATIONS

Willy M. C. Sansen, et al. "An Integrated Wide–Band Variable–Gain Amplifier with Maximum Dynamic Range," IEEE Journal of Solid–State Circuits, vol. SC–9, No. 4, Aug. 1974, pp. 159–166.

Barrie Gilbert, "Advances in BJT Techniques for High–Performance Transceivers," Proc. of 1997 IEEE Ecirc. pp. 31–38.

* cited by examiner

Primary Examiner—Nguyen T. Vo
(74) Attorney, Agent, or Firm—Oblon, Spivak, McClelland, Maier & Neustadt, P.C.

(57) ABSTRACT

The variable gain circuit comprises a gain control signal correction circuit which corrects a gain control signal Vx to obtain a corrected gain control signal Vy and a variable gain amplifier which controls the gain in accordance with the corrected gain control signal Vy. The gain control signal correction circuit has input/output characteristic of: $Vy=Vt \times \ln\{\exp(b \times Vx/Vt)-1\}$, where, Vt is a thermal voltage, and $b \geq 0$. The transfer function (gain) from the input signal current $I_{sig}$ to the output signal current Ia of the variable gain amplifier is represented by: $Ia/I_{sig}=1/[1+\exp(Vx/Vt)]$. Thus, the gain can be controlled in exponential function to the gain control signal Vx.

14 Claims, 5 Drawing Sheets

$Vy = Vt \ln\{\exp(bVx/Vt)-1\}$
$Vx >= 0$ $I1 = I0 \exp(-bVx/Vt)$
$Vx >= 0, b > 0$

VARIABLE GAIN CIRCUIT

BACKGROUND OF THE INVENTION

The present invention relates to a variable gain circuit, more particularly, to a variable gain circuit which is configured such that the gain exponentially varies with regard to the gain control signal, a low electric power is consumed, and it can be applied to portable wireless devices.

This application is based on Japanese Patent Application No. 10-370290, filed Dec. 25, 1998, the entire content of which is incorporated herein by reference.

In recent years, developments of wireless communication apparatuses represented by portable or mobile telephone units have been made vigorously. These wireless communication apparatuses are required to be small sized and lightweight, as they are used by carrying by man or in the form of being loaded on automobile. Accordingly, as the parts which constitute the apparatuses there are strongly desired the monosilic IC (integrated circuit) parts which are suited to make small sized, lightweight, and low power consuming type, rather than the conventional parts of hybrid constitution formed by connecting many units of constituting parts. Besides the miniaturization of parts, price reduction of apparatuses is naturally required, for which formation of monosilic IC type is a technique essential for price reduction.

In a wireless transmitting/receiving circuit in such wireless communication apparatus, a variable gain amplifier is included in an IF (intermediate frequency) stage, and the IF signal can be adjusted to a moderate level by the variable gain amplifier. According to a wireless communication apparatus of CDMA (code divisional multiplex access), because the transmission gain circuit of this IF stage is required to carry out an extensive gain control that permits a signal level control for 70 dB or more.

In general, in order to carry out a gain control of such extensive range, it is required to make adjustment of the signal level in exponential function to the gain control signal. However, as described below, in a conventional variable gain amplifier, the range in which the signal level can be adjusted in exponential function to the gain control signal is considerably limited and it is difficult to respond to the above requirement, and there is a problem that the control becomes difficult when it is intended to change the gain in excess of this range.

A Gilbert type variable gain amplifier is shown in FIG. 1. Transistors Q100 and Q101 constitute a differential transistor pair, wherein an input signal current Isig is inputted to the common emitter terminal, and the output signal current Ia is taken out from the collector terminal of one transistor (herein, Q100). In order to form an output signal current Ia by multiplexing the input signal current $I_{sig}$ by a predetermined gain multiple, a gain control signal Vx is inputted between the base terminals of the transistors Q100 and Q101. The current ($I_{sig}$–Ia) flowing to the collector terminal of the other transistor (herein, Q101) is regarded as unnecessary current, and is designed to flow into th e power source Vcc or the like.

The gain of this variable gain amplifier, i.e., a transfer function from the input signal current $I_{sig}$ to the output signal current Ia, is approximately represented by the following Equation 1:

$$Ia/I_{sig} = 1/\{1+\exp(Vx/Vt)\} \quad (1)$$

where, Vt is a thermal voltage, which is approximately 26 mV at a room temperature.

Under the condition of $1 \ll \exp(Vx/Vt)$, Equation 1 can be approximated to $Ia/I_{sig}=1/\exp(Vx/Vt)$, so that it is known that the gain varies (decreases) in exponential function to the gain control signal Vx. However, in case the conditions of $1 \ll \exp(Vx/Vt)$ do not hold good, for example, in the region where the gain control signal Vx is no more than zero, the relation between Vx and gain becomes, as shown in Equation 1: $1/\{1+\exp(Vx/Vt)\}$, which is not the relation to change in exponential function. Namely, when the assumption of $1 \ll \exp(Vx/Vt)$ does not hold good to the gain control signal Vx, then the change of the gain to the gain control signal Vx becomes no longer exponential function like. The state of change in the gain G to the gain control signal Vx is shown in FIG. 2. In this manner, down to a certain level of the gain control signal Vx the gain G (dB) increases linearly in proportion to the decrease of the control signal Vx, but under the certain level, the rate of decrease in gain G (dB) is lowered in comparison with the decrease in the control signal Vx.

In case of carrying out a gain control in the wireless communication apparatus or the like, there is required from the point of facility of control that the gain is changed in exponential function to the gain control signal Vx, in other words, that the relation between the gain control signal Vx and the gain in decibel expression is linear type. However, as described above, in the variable gain amplifier of FIG. 1, such a linear-in-dB relation is obtainable only in the range for Vx to satisfy the conditions of $1 \ll \exp(Vx/Vt)$, so that the gain control cannot be made by extensively changing Vx. Furthermore, the gain $Ia/I_{sig}$ with which such linear-in-dB relation can be obtained is no more than ½ in the maximum, which means to discard about half the IF signal which is an input signal current $I_{sig}$, so that there is a problem of lowering S/N ratio of the signal outputted from the variable gain circuit.

As described above, the conventional variable gain amplifier has had a narrow range in which the gain can be controlled in exponential function to the gain control signal, thus involving a problem that the control becomes difficult when gain control is attempted in excess of the range.

BRIEF SUMMARY OF THE INVENTION

Accordingly, it is an object of the present invention to provide a variable gain circuit in which the gain controllable range in exponential function to the gain control signal can be expanded.

According to the present invention, there is provided a variable gain circuit comprises:

a gain control signal correction circuit which corrects in the following manner a gain control signal Vx which varies linearly to the gain in decibel expression to obtain the corrected gain control signal Vy:

$$Vy = Vt \times ln\{\exp(b \times Vx/Vt) - 1\}$$

where, Vt is a thermal voltage, and $b \geq 0$ a gain control circuit which controls the gain of the input signal according to the corrected gain control signal Vy, wherein the gain control circuit has a transfer function to be represented by the following equation:

$$Is/I_{sig} = 1/\{1+\exp(Vy/Vt)\}$$

wherein the input signal current is $I_{sig}$, and the output signal current is Ia.

According to the present invention, there is provided another variable gain circuit comprising:

a gain control signal correction circuit which corrects in the following manner a gain control signal Vx which varies linearly to the gain in decibel equation to obtain the corrected gain control signal Vy:

$$Vy = Vt \times ln\{exp\ (b \times Vx/Vt) - 1\}$$

where, Vt is a thermal voltage, and $b \geq 0$ a gain control circuit which controls the gain of the input signal according to the corrected gain control signal Vy, wherein the gain control circuit comprises a differential transistor pair in which an input signal current is inputted to the common emitter terminal, a corrected gain control signal is supplied to a point between the base terminals of the two transistors, and an output signal current is taken out from the collector of one transistor.

According to the present invention, there is provided a further variable gain circuit comprising:

a gain control signal correction circuit which corrects in the following manner a gain control signal Vx which varies linearly to the gain in decibel expression to obtain the corrected gain control signal Vy:

$$Vy = Vt \times ln\{exp\ (b \times Vx/Vt) - 1\}$$

where, Vt is a thermal voltage, and $b \geq 0$ a gain control circuit which controls the gain of the input signal according to the corrected gain control signal Vy, wherein the gain control circuit comprises a first differential transistor pair in which a positive input signal current is inputted to the common emitter terminal; a corrected gain control signal is supplied to a point between the base terminals of the two transistors; and an output signal current is taken out from the collector of one transistor, and a second differential transistor pair in which a negative input signal current is inputted to the common emitter terminal; a corrected gain control signal is supplied to a point between the base terminals of the two transistors; and an output signal current is taken out from the collector of one transistor.

In the variable gain circuit according to the present invention, the gain control signal Vx is corrected so as to be converted to the corrected gain control signal $Vy = Vt \times ln\{exp\ (b \times Vx/Vt) - 1\}$ by the gain control signal correction circuit, after which it is inputted to the gain control circuit. The transfer function (gain) of the gain control circuit, namely, the ratio of the output signal current Ia to the input signal current $I_{sig}$ is $Ia/I_{sig} = 1/\{1 + exp\ (Vy/Vt)\}$, and when the relation of $Vy = Vt \times ln\ \{exp\ (b \times Vx/Vt) - 1\}$ is substituted into it, the result becomes $Ia/I_{sig} = exp\ (-b \times Vx/Vt)$, which shows variation in exponential function to the gain control signal Vx.

Accordingly, the gain $Ia/I_{sig}$ can be varied in exponential function to Vx from the region of zero. Namely, the range in which the gain can be controlled in exponential function to the gain control signal Vx is expanded.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a variable gain circuit according to the present invention will now be described with reference to the accompanying drawings.

First Embodiment

Figure 2:
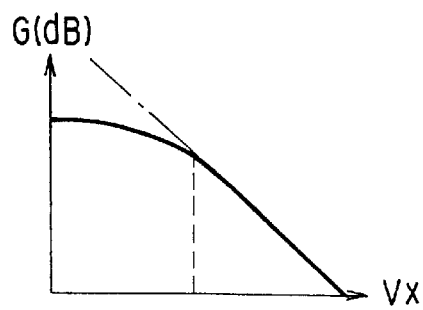
FIG. 2 is a view showing a gain control characteristics.
Figure 3:
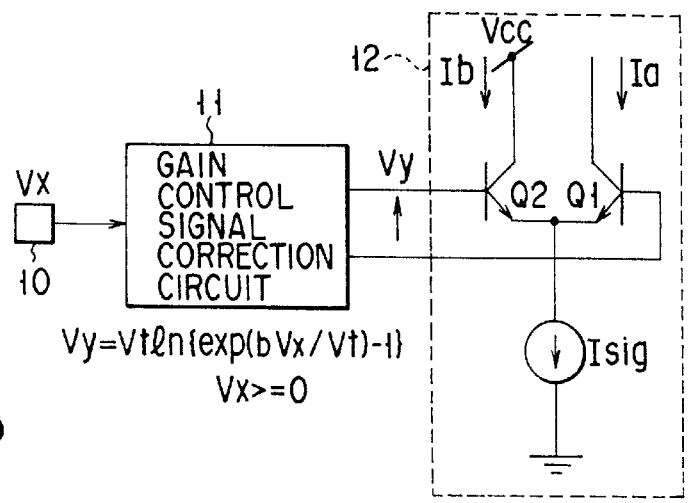
FIG. 3 is a view showing the basic constitution of a first embodiment of the variable gain circuit according to the present invention.

FIG. 3 is a view showing the basic constitution of the variable gain circuit according to a first embodiment of the present invention. To a gain control signal input terminal 10, a gain control signal Vx for controlling the gain of the variable gain amplifier 12 from outside is inputted. The gain control signal Vx is set to vary linearly to the gain in decibel expression. However, as described above, even if this is inputted as such in the Gilbert type variable gain circuit, the gain in decibel expression varies linearly only in the range where the gain control signal Vx satisfies the condition of $1 << exp\ (Vx/Vt)$. When Vx is lower than the lower limit where Vx satisfies the condition of $1 << exp\ (Vx/Vt)$, the extent of increase of the gain G (dB) to the decrease of the gain control signal Vx decreases as shown in FIG. 2. Accordingly, in the present invention, in order to correct the increase in the gain G (dB) of the Gilbert type variable gain circuit under the lower limit where Vx satisfies the condition of $1 << exp\ (Vx/Vt)$, the gain control signal Vx is inputted to a gain control signal correction circuit 11 to effect correction, whereby the corrected gain control signal Vy is supplied to a Gilbert type variable gain amplifier 12.

Figure 1:
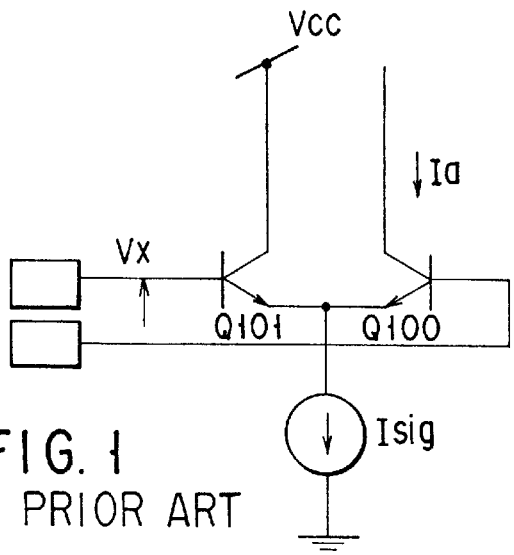
FIG. 1 is a circuit diagram showing the conventional variable gain circuit.

The variable gain amplifier 12 is a circuit in which the gain is controlled by the corrected gain control signal Vy, and it comprises transistors Q1 and Q2 which constitute a differential transistor pair in the same manner as in the variable gain amplifier shown in FIG. 1. To a common emitter terminal of the transistors Q1 and Q2, input signal current $I_{sig}$ is inputted, and the output current Ia is taken out from the collector terminal of one transistor (herein, Q1). The current Ib (Ib=$I_{sig}$–Ia) which flows to the collector terminal of the other transistor (herein, Q2) is an unnecessary current, which is designed to flow into the power source Vcc or the like.

The corrected gain control signal Vy outputted from the gain control signal correction circuit 11 is a voltage signal, which is inputted to the point between the base terminals of the transistors Q1 and Q2 of the variable gain amplifier 12. The gain control signal correction circuit 11 corrects the gain control signal Vx according to the input/output characteristics of the following equation, and outputs the corrected gain control signal Vy.

$$Vy = Vt \times \ln\{\exp(b \times Vx/Vt) - 1\} \quad (2)$$

where, b is a constant (b≧0), Vt is a thermal voltage, and Vx (≧0) is the gain control signal from outside. However, in case of Vx=0, Vy becomes –∞ from Equation 2, in which case it should be assumed that the input signal current $I_{sig}$ flows only into the one transistor Q1 of the differential transistor pair.

Next, explanation is given on the fact that, when such corrected gain control signal Vy is inputted to the variable gain amplifier 12, the output signal current Ia varies in exponential function to the gain control signal Vx.

Figure 11:
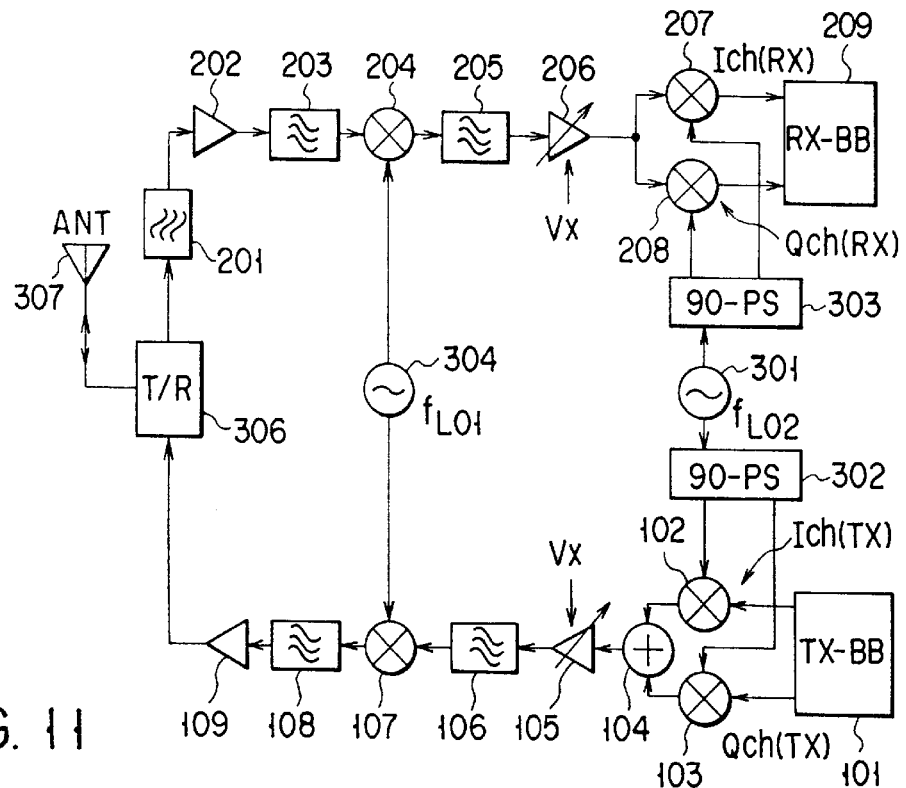
FIG. 11 is a block diagram showing an example of constitution of the wireless circuit section of the wireless transmitter/receiver by heterodyne system as an application example of the present invention.

The gain of the variable gain amplifier 12 shown in FIG. 2, namely, the transfer function from the input signal current $I_{sig}$ to the output signal current Ia, is represented by the following Equation 3:

$$Ia/I_{sig} = 1/\{1 + \exp(Vy/Vt)\} \quad (3)$$

where, Vt is a thermal voltage, which is about 26 mV at room temperature. Equation 3 is the same as Equation 1 with the exception that the gain control signal Vx in Equation 1 which represents the transfer function of the conventional variable gain circuit shown in FIG. 11 is replaced by the corrected gain control signal Vy which is corrected by the gain control signal correction circuit 11.

When Equation 2 is substituted into Vy of Equation 3, the following relation is obtained:

$$\begin{aligned}
Ia/I_{sig} &= 1/\{1 + \exp(Vy/Vt)\} \quad (4)\\
&= 1/[1 + \exp(Vt/Vt)\ln\{\exp(b \times Vx/Vt) - 1\}]\\
&= 1/\{1 + \exp(b \times Vx/Vt) - 1\}\\
&= 1/\{\exp(b \times Vx/Vt)\}\\
&= \exp(-b \times Vx/Vt)
\end{aligned}$$

It can be observed from Equation 4 that, when the gain control signal Vx is increased to the positive direction from 0, the gain decreases in exponential function. Further, in case the gain control signal Vx is 0, the gain $Ia/I_{sig}$ is 1, and the input signal current $I_{sig}$ is to be outputted fully as output signal current Ia.

In the variable gain amplifier shown in FIG. 1, the relation of $Ia/I_{sig}=1/\exp(Vx/Vt)$ is obtainable only in case the conditions of the transfer function shown in Equation 1 hold good and, as described above, when the conditions of 1<<exp (Vx/Vt) hold good. For example, in the region where $Ia/I_{sig}$ is near ½, $Ia/I_{sig}$ does not vary in exponential function to the gain control signal Vx. To the contrary, in the present invention it is apparent that $Ia/I_{sig}$ can be varied to the gain control signal Vx to a range of $Ia/I_{sig}=1$ in exponential function. That is to say, it is possible to expand the range where the gain varies in exponential function to the gain control signal Vx to a large extent in comparison with the conventional variable gain amplifier.

Next, using FIGS. 4 to 7, several specific examples of the gain control signal correction circuit 11 in the first embodiment are explained. First example of the gain control signal correction circuit 11.

Figure 4:
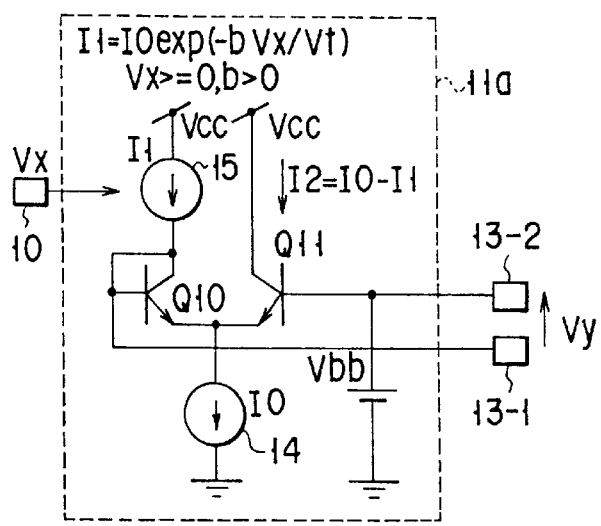
FIG. 4 is a circuit diagram showing the first example of the gain control signal correction circuit in the first embodiment.

The gain control signal correction circuit 11a shown in FIG. 4 comprises the differential transistor pair comprising the transistors Q10 and Q11 as the main elements. To the common emitter terminal of the transistors Q10 and Q11 direct current (DC) source 14 (current $I_0$) is connected. The transistor Q10, one of the differential transistor pair, is of a so-called diode connection having connections of a collector terminal and a base terminal. To the collector terminal variable direct current source 15 (current $I_1=I_0 \times \exp(-b \times Vx/Vt)$) is connected. The base terminal of the other transistor Q11 of the differential transistor is connected to the power source Vbb, and is fixed to a predetermined direct current level. The collector terminal is connected to other power source Vcc. The potential differences between the base terminals of the transistors Q10 and Q11 are outputted from the output terminals 13-1, 13-2 as the corrected gain control signals Vy.

It is required that the input impedance of the variable gain amplifier 12 is high when viewed from the output terminals 13-1 and 13-2 of the gain control signal correction circuit 11. As shown in FIG. 3, since the corrected gain control signal Vy is inputted to the point between the base terminals of differential transistor pair Q1 and Q2 of the variable gain amplifier 12, the input impedance can be regarded as being high.

In the gain control signal correction circuit 11a having the constitution as shown in FIG. 4, the relation between the gain control signal Vx which is an input and the corrected gain control signal Vy which is an output satisfies Equation 2 as follows. However, in this passage, base current of each transistor is small, it is neglected to carry out analysis.

As the corrected gain control signal Vy is a potential difference between the base terminals of the transistors Q10 and Q11, the relation becomes Vy=VBE (Q11)–VBE (Q10), wherein VBE (Q10) and VBE (Q11) are respectively the voltages between the base and the emitter of the respective transistors Q10 and Q11. Accordingly, the corrected gain control signal Vy can be represented by the following equation:

$$\begin{aligned}
Vy &= Vt[\ln\{(I_0 - I_1)/Is\} - \ln(I_1/Is)] \quad (5)\\
&= Vt \times \ln\{(I_0 - I_1)/-1\}\\
&= Vt \times \ln[I_0/\{I_0 \times \exp(-b \times Vx/Vt)\} - 1]\\
&= Vt \times \ln\{\exp(b \times Vx/Vt) - 1\}\\
&= \text{right side of Equation 2}
\end{aligned}$$

In this manner, the gain control signal correction circuit 11a shown in FIG. 4 satisfies Equation 2. Thus, by using this correction circuit 11a as a gain signal correction circuit 11 in FIG. 3, the gain of the variable gain amplifier 12 can be varied in exponential function to the gain control signal Vx. In other words, the relation between the gain control signal Vx and the gain Ia/$I_{sig}$ which is expressed in logarithm (decibel) can be in linear form.

Second Example of the Gain Control Signal Correction Circuit 11

Figure 5:
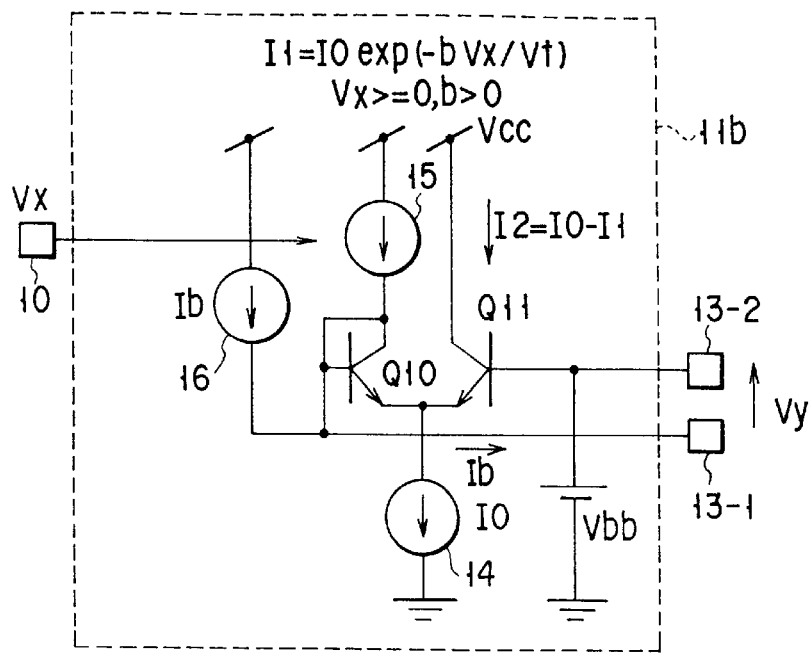
FIG. 5 is a circuit diagram showing the second example of the gain control signal correction circuit in the first embodiment.

The gain control signal correction circuit 11b shown in FIG. 5 shows an example of a circuit for compensating for the base current which was disregarded in the gain control signal correction circuit 11a shown in FIG. 4. Its difference from FIG. 4 is in the point that a current source (current 1b) 16 for compensating for the base current is connected to the base terminal of the transistor Q10.

In general, the variable gain amplifier 12 has large current in comparison with the gain control signal correction circuit 11, because of which, in the gain control signal correction circuit 11a shown in FIG. 4, a part of the current $I_1$ which should be fed to the transistor Q10 flows to the variable gain amplifier 12 to cause a gain error to the gain set amount by the gain control signal Vx.

The operating current of the variable gain amplifier 12 and β (current amplification factor) of transistor are known from the IC manufacturing process, the base current to be taken in by the variable gain amplifier 12 is presumable. Based on this presumed amount, the current Ib of the current source 16 for compensation for the base current can be set. Further, as described later, compensation for base current may be made by using the base current monitor circuit.

Third Example of the Gain Control Signal Correction Circuit 11

Figure 6:
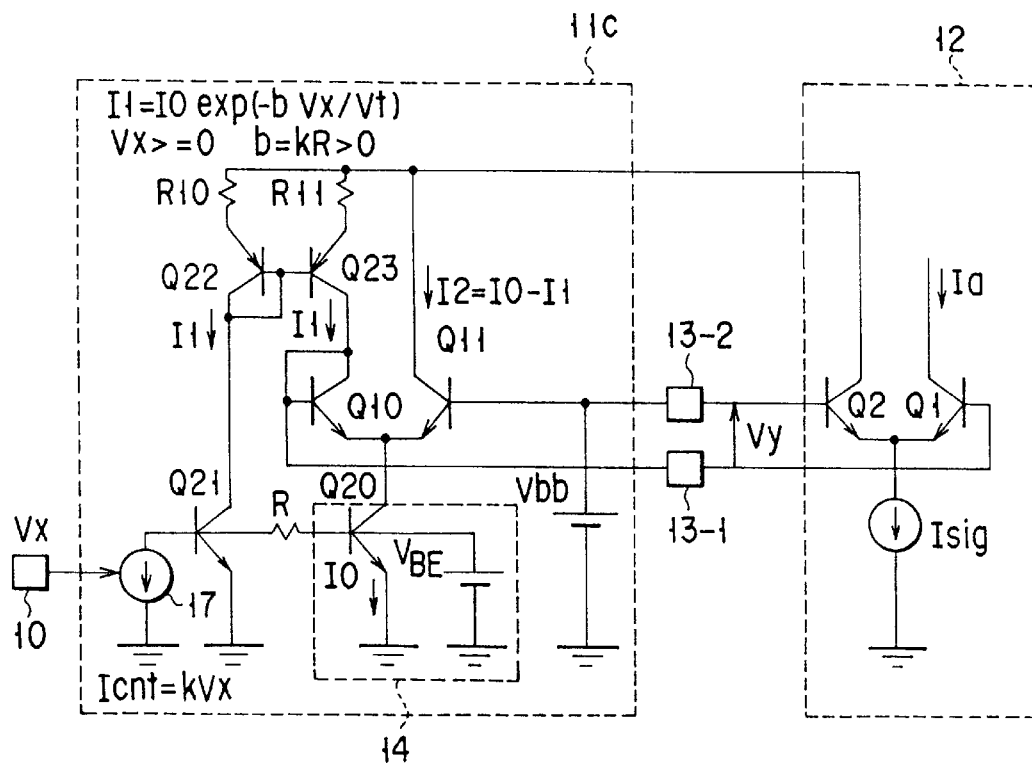
FIG. 6 is a circuit diagram showing the third example of the gain control signal correction circuit in the first embodiment and a gain control circuit.

The gain control signal correction circuit 11c shown in FIG. 6 shows more specifically the gain control circuit 11a shown in FIG. 4. To describe only the points of difference from that described in FIG. 4, the current source 14 which generates the direct current Io in FIG. 4 is realized by the voltage source $V_{BE}$ and the first transistor Q20. The base terminal of the transistor Q20 is connected to the voltage source $V_{BE}$ and an end of resistor R, and the other end of the resistor R is connected to the base terminal of the second transistor Q21 and a gain control current source 17 (current $I_{cnt}$=k×Vx).

The gain control current source 17 generates direct current $I_{cnt}$ proportionate to the voltage of the gain control signal Vx (proportional factor to be k). Such a gain control current source 17 can be simply realized by using the well known voltage-current conversion circuit constituted by the differential circuit in which the linear range is enlarged by connecting, for example, an emitter degeneration resistor between the emitter terminals. Accordingly, detailed description is omitted here.

The emitter terminal of the transistor Q21 is grounded, and the collector terminal thereof is connected to the current input terminal (base/collector terminal of transistor Q22) of the current mirror circuit comprising the transistors Q22 and Q23 and resistors R10 and R11. The current output terminal of the current mirror circuit (collector terminal of the transistor Q23) is connected to the collector terminal of the transistor Q10.

In the gain control signal correction circuit 11c constituted in this manner, the current of $I_1=I_0×exp(-b×Vx/Vt)$ as described above is supplied to the collector terminal of the transistor Q10 from the current output terminal of the current mirror circuit comprising the transistors Q22 and Q23 and resistors R10 and R11. This point is explained in detail below.

The collector current Io of the transistor Q20 is represented by the following equation:

$$I_0 = Is \times \exp(V_{BE}/Vt) \quad (6)$$

where Is is a saturation current and is determined based on a manufacturing process.

On the other hand, since the base voltage of the transistor Q21 is a voltage which is lowered by a voltage of $I_{cnt}$×R ($I_{cnt}$ represents a current value of gain control current source 17 and R represents a resistance value of resistor R) from the voltage of the voltage source $V_{BE}$, the collector current $I_1$ of the transistor Q21 can be represented by the following equation:

$$\begin{aligned} I_1 &= Is \times \exp\{(V_{BE} - I_{cnt} \times R)/Vt\} \quad (7)\\ &= Is \times \exp(V_{BE}/Vt)\exp(-I_{cnt} \times R/Vt)\\ &= I_0 \times \exp(-k \times Vx \times R/Vt)\\ &= I0 \times \exp(-b \times Vx/Vt) \end{aligned}$$

Accordingly, it can be seen that the current $I_1=I_0×\exp(-b×Vx/Vt)$ is formed by this circuit.

Furthermore, considering the dispersion factor in IC manufacturing, there is a possibility for the current $I_1$ to become large to the maximum value of the current $I_0$, and in such case there should be a region where the gain control is non-sensitive to the gain control signal Vx.

In order to obviate generation of the region which is non-sensitive to the gain control by the gain control signal Vx, the input/output current ratio in the current mirror circuit may be set to a level less than 1. In other words, the emitter area of the transistor Q22 may be made larger than the emitter area of the transistor Q23, or the amount of the resistor R10 connected to the emitter of the transistor Q22 may be made smaller than the resistor R11 connected to the emitter of the transistor Q23.

Therefore, it becomes possible to obtain a state of $I_0>I_1$ within the range of dispersion, and to eliminate the region of non-sensitivity to gain control by the gain control signal Vx. However, even when Vx is 0, the state of $I_1<I_0$ is kept, so that the maximum gain is to be lowered. This, however, is not a practical problem, as it becomes possible to suppress degradation of the maximum gain to a level lower than 1 dB by detailed design.

On the other hand, in case it is desired to carry out gain control from Vx=A (A>0), a procedure reverse to the above may be taken. Namely, in order to obtain $I_0<I_1$, the input/output current ratio of the current mirror circuit may be set to 1 or more. In other words, the emitter area of the transistor Q22 may be made smaller than the emitter area of the transistor Q23, or the amount of the resistor R10 may be made larger than that of the resistor R11. This is effective in the case where the gain control signal Vx cannot output 0 V, for example, where it can only output the amount higher than 0.5 V.

Fourth Example of the Gain Control Signal Correction Circuit 11

Figure 7:
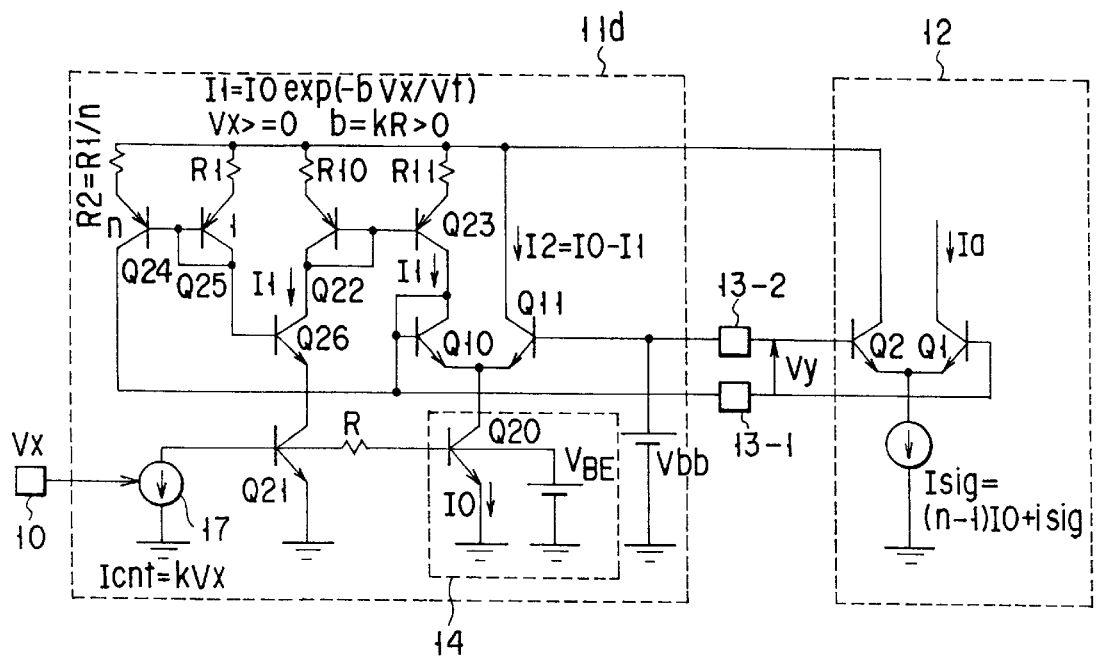
FIG. 7 is a circuit diagram showing the fourth example of the gain control signal correction circuit in the first embodiment and a gain control circuit.

The gain control signal correction circuit 11d shown in FIG. 7 shows more specifically the gain control circuit 11b shown in FIG. 5. As described above, it has a function to compensate for the base current by monitoring the base current.

To describe the points of difference from FIG. 5, in FIG. 7, there are provided a third transistor Q26 and first and second current mirror circuits in the gain control signal correction circuit 11d. More specifically, to the collector terminal of the second transistor Q21 the emitter terminal of the third transistor Q26 is connected, and the collector terminal of the transistor Q26 is connected to the current input terminal of the first current mirror circuit comprising the transistors Q22 and Q23 and resistors R10 and R11 (base/collector terminal of the transistor Q22). This output terminal of the first current mirror circuit (collector terminal of the transistor Q23) is connected to the collector terminal of the transistor Q10.

On the other hand, to the base terminal of the third transistor Q26, there is connected a current input terminal of the second current mirror circuit (base/collector terminal of the transistor Q25) comprising the transistors Q24 and Q25 and resistors R1 and R2. This current output terminal (collector terminal of the transistor Q24) of the second current mirror circuit is connected to the base/collector terminal of the transistor Q10 and the base terminal of the transistor Q1.

Here, the direct current component of the input signal current $I_{sig}$ in the variable gain amplifier 12 is set to be $(n-1) \times I_0$, and the collector current of the first transistor Q20 and the collector current of the second transistor Q21 at the time when the gain control signal Vx is 0 are both set to be $I_0$. Furthermore, the emitter area ratio of the transistors Q24 and Q25 which constitute the second current mirror circuit is set to be n:1, and the ratio of the resistors R1 to R2 to be R1:R2=n:1.

In the gain control signal correction circuit 11d constituted in this manner, when Vx =0, the base current $I_0/\beta$ ($\beta$: current amplification factor) of the third transistor Q26 is inputted to the base/collector terminal of the transistor Q25 which is the current input terminal of the second current mirror circuit, multiplied by "n" in the current mirror circuit, and $n \times I_0/\beta$ is outputted from the collector terminal of the transistor Q24 which is a current output terminal.

In case of Vx=0, the current flowing in the transistor Q10 is $I_0$, and the current flowing in the transistor Q1 is $(n-1) \times I_0$, the sum of the base current of these two transistors Q10 and Q1 becomes $I_0/\beta+(n-1) \times I_0/\beta=n \times I_0/\beta$. These base currents are supplied by the second current mirror circuit, as described above. Accordingly, it no longer occurs that a part of the current $I_1$ to be fed to the collector of the transistor Q10 is supplied to the base of the transistor Q10 and the base of the transistor Ql in the variable gain amplifier 12, and the gain set by the gain control signal Vx is correctly obtained.

As described above, according to the present embodiment, the gain control signal Vx inputted from external source is corrected so as to be converted to the corrected gain control signal of Vy=Vt×ln{exp (b×Vx/Vt)– 1} by the gain control signal correction circuit 11, after which it is inputted to the variable gain amplifier 12. The transfer function (gain) of the variable gain amplifier 12, namely, the ratio of the output signal current Ia to the input signal current $I_{sig}$, is $Ia/I_{sig}=1/\{1+\exp (Vy/Vt)\}$. When the relation of Vy=Vt×ln{exp (b×Vx/Vt) –1} is substituted into it, the result becomes: $Ia/I_{sig}=\exp(-b \times Vx/Vt)$, which shows variation in exponential function to the gain control signal Vx. Consequently, the gain $Ia/I_{sig}$ can be varied (decreased) in exponential function to the gain control signal Vx from the 0 region of the gain control signal Vx, thus making it possible to control the gain in exponential function over extensive range.

Other embodiments of the variable gain circuit according to the present invention will be described. The same portions as those of the first embodiment will be indicated in the same reference numerals and their detailed description will be omitted.

Second Embodiment

Figure 8:
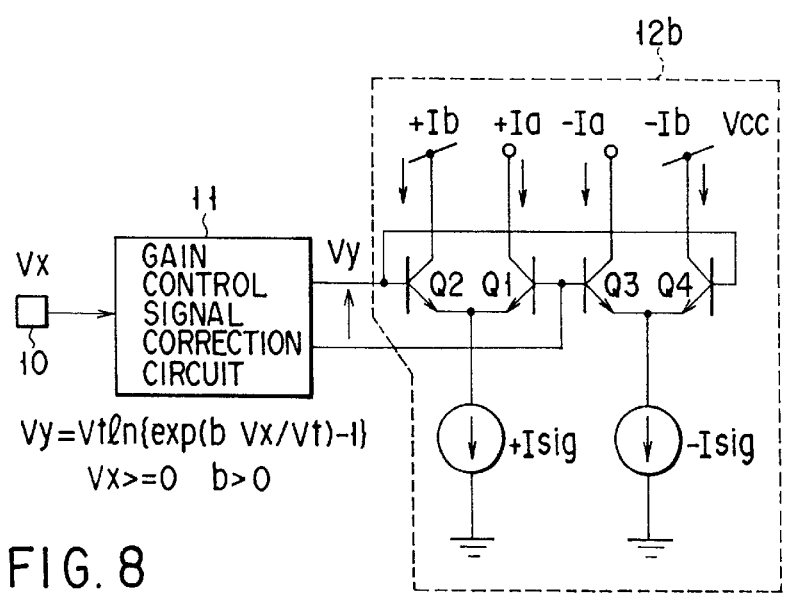
FIG. 8 is a view showing the basic constitution of the second example of the variable gain circuit according to the present invention.

FIG. 8 is a view showing the basic constitution of the variable gain circuit according to the second embodiment of the present invention. It shows a case in which the variable gain amplifier is formed by a differential circuit. A gain control signal Vx which is inputted into the input terminal 10 from external source is converted to a corrected gain control signal Vy by the gain control signal correction circuit 11, after which it is supplied to the variable gain amplifier 12b. This sequence is the same as that of the first embodiment shown in FIG. 2.

A variable gain amplifier 12a is constituted mainly by the transistors Q1 and Q2 which constitute first differential transistor pair and transistors Q3 and Q4 which constitute second differential transistor pair.

In the first differential transistor pair, a positive input signal current $+I_{sig}$ is inputted into the common emitter terminal of the transistors Q1 and Q2, and a positive output signal current +Ia is taken out from the collector terminal of one transistor Q1. In the same manner, in the second differential transistor pair, a negative input signal current $-I_{sig}$ is inputted into the common emitter terminal of the transistors Q3 and Q4, and a negative output signal current –Ia is taken out from the collector terminal of one transistor Q3. The collector current +Ib and –Ib of the transistors Q2 and Q4 which is not taken out as output signal current is to flow to the non-illustrated voltage source Vcc.

By the supply of the corrected gain control signal Vy from the gain control signal correction circuit 11 to a point between the base terminals of the two transistors Q1 and Q2 of the first differential transistor pair, and to a point between the base terminals of the two transistors Q3 and Q4 of the second differential transistor pair, the gain of the variable gain amplifier 12 is controlled.

The relation between vy and Vx in the gain control signal correction circuit 11 is similar to that of FIG. 3, and illustration thereof is omitted here. Therefore, with respect to the specific examples of the gain control signal correction circuit 11, the circuit examples given in the first embodiment, 11a, 11b, 11c, and 11d are all applicable. However, here is described as a more specific example of the variable gain circuit 12 of the second embodiment, using FIG. 9 and FIG. 10.

First Specific Example of the Variable Gain Circuit

Figure 9:
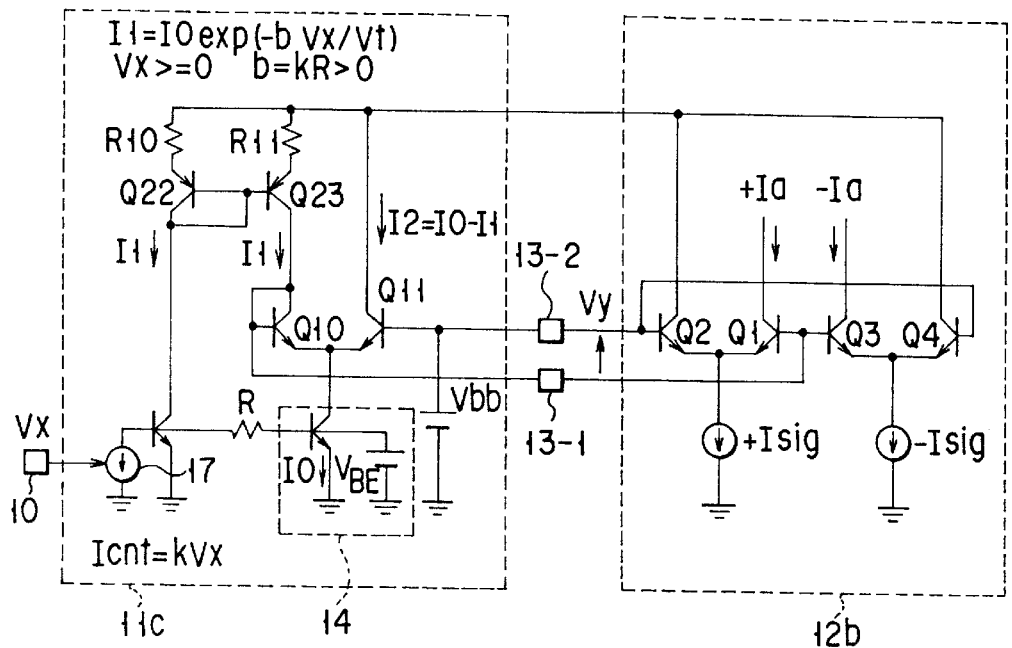
FIG. 9 is a circuit diagram showing the first example of the gain control signal correction circuit in a second embodiment and a gain control circuit.

FIG. 9 is a first specific example, which shows the third specific example 11c of the gain control signal correction circuit 11 in the first embodiment shown in FIG. 8 in combination with the variable gain amplifier 12b which is made into differential circuit as described in FIG. 8. Since the operations of the gain control signal correction circuit 11c and the variable gain amplifier 12b are as explained with respect to FIG. 6 and FIG. 8, detailed description is omitted here.

Second Specific Example of the Variable Gain Circuit

Figure 10:
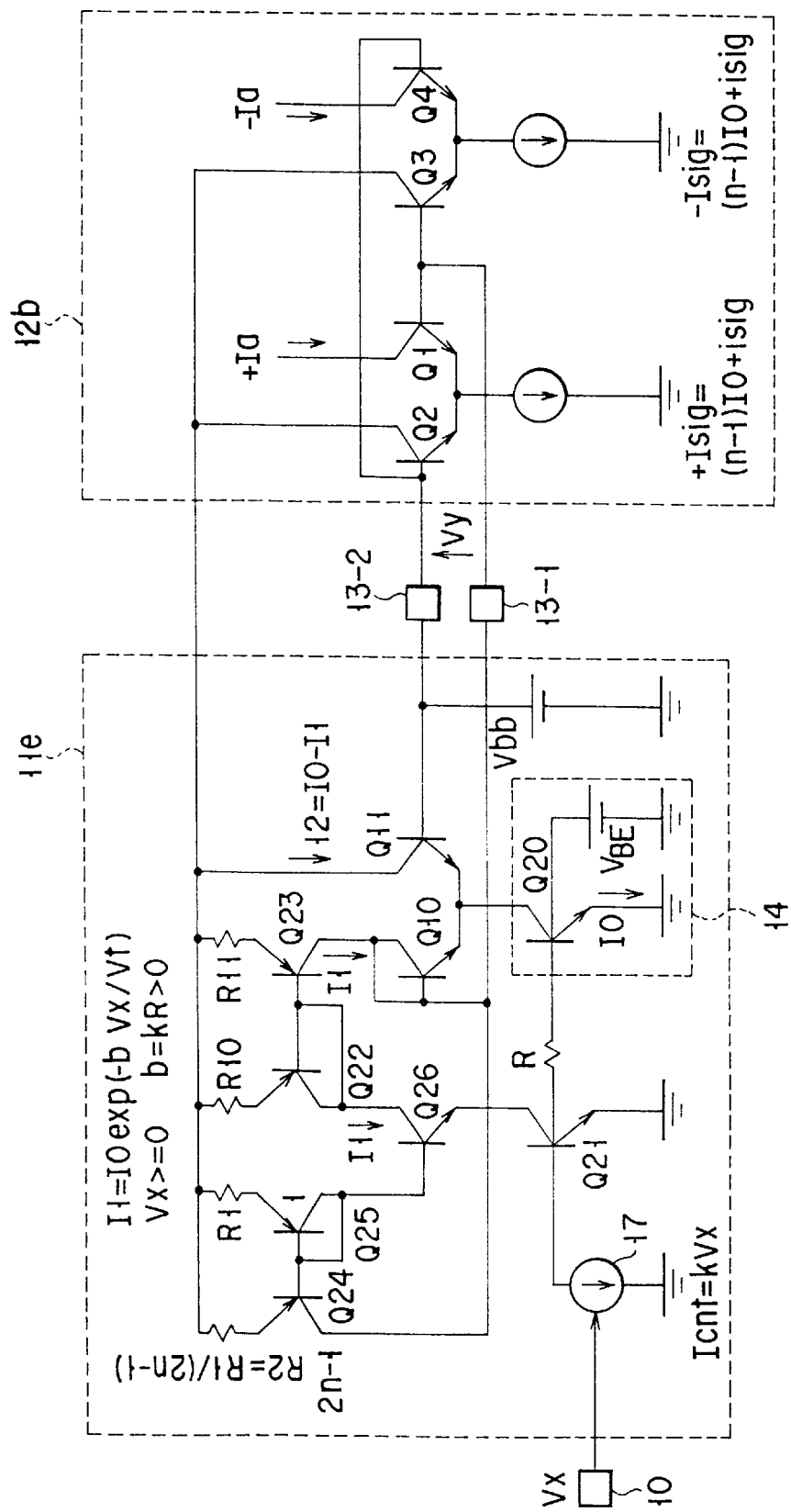
FIG. 10 is a circuit diagram showing the second example of the gain control signal correction circuit in the second embodiment and a gain control circuit.

FIG. 10 shows a second specific example, which is an example of the gain control signal correction circuit 11e which is almost same as the gain control signal correction circuit lid as described in FIG. 7 being combined with the variable gain amplifier 12b which is made into differential circuit as illustrated in FIG. 8.

The gain control signal correction circuit lie has the same constitution as the gain control signal correction circuit 11d shown in FIG. 7 in circuit constitution, but it is differentiated from the circuit of FIG. 7 in the transistor size ratio and resistance ratio of the second current mirror circuit comprising the transistors Q25 and Q24 and the resistors R1 and R2, from the that of FIG. 7 (1:n) in order to compensate for the base current of the transistor Q10, and the base current of the transistors Q1 and Q3 of the variable gain amplifier 12b formed into differential circuit.

Specifically, as shown in FIG. 10, the emitter area ratio of the transistors Q25 and Q24 is made to 1:(2n–1), and the resistance ratio of the resistors R1 and R2 to (2n−1):1. By this setting, it is possible to compensate for the base current of Q1 and Q3 and Q10 to obtain accurately the gain set by the gain control signal Vx.

As described above, even by the second embodiment, the gain control signal Vx to be inputted from outside is corrected by the gain control signal correction circuit 11 to be converted to the corrected gain control signal of Vy=Vx× ln{exp(b×Vx/Vt)−1}, and then inputted to the differentiated variable gain amplifier 12b, and therefore, in the same manner as in the first embodiment, the gain control signal Vx can vary (decrease) the gain $Ia/I_{sig}$ in exponential function to the gain control signal Vx from the region of 0, so that the gain can be controlled in exponential function over broad range.

Application Example

Next, as an example of applied system of the variable gain circuit according to the present invention, description is made on the wireless transmitter/receiver circuit in the portable telephone unit and other mobile wireless communication apparatuses. FIG. 11 shows a constitution of the wireless transmitter/receiver circuit of heterodyne system. In this text, explanation is given on an example of a TDD (Time Division Duplex) system which is designed to perform changeover of transmission and receiving by time division, but the case is not necessarily limited to it. Transmission system is illustrated. A transmission side base band processing unit 101 has a base band signal generating unit and a band limit filter (not illustrated), through which two base band signals Ich (TX) and Qch (TX) generated in the base band signal generating unit and filtered by the band limit filter and outputted. These base band signals Ich (TX) and Qch (TX) are inputted to an orthogonal modulator comprising multipliers 102 and 103 and an adder 104, and modulate the second local oscillation signal having a frequency $f_{LO2}$. The second local oscillation signal is generated by the local oscillator 301, and divided into the two orthogonal signals by the 90 degree phase shifter 302 and inputted to the orthogonal modulator.

The signal after modulation outputted from the orthogonal modulator is an IF signal, which is inputted to a variable gain circuit 105 of the present invention. The variable gain circuit 105 is a variable gain circuit based on the present invention as explained so far with reference to FIG. 2, FIG. 8, and the like, which adjusts the IF signal inputted according to the gain control signal from the non-illustrated control system (corresponding to the gain control signal Vx) to a suitable signal level.

In the previously explained variable gain circuit of the first and second embodiments, an output signal is taken out as a current signal, but when the voltage signal is required as an output of the variable gain circuit 105, the current signal is converted into the voltage signal and outputted.

The IF signal which is outputted from the variable gain circuit 105 generally contains unnecessary harmonics which are generated in the orthogonal modulator and the variable gain circuit 105, and accordingly, it is inputted to an up-converter 107 through a filter 106 comprising a low-pass filter (LPF) or a band-pass filter (BPF) for removing such unnecessary component.

The up-converter 107 performs multiplication of the IF signal with first local oscillation signal having the frequency $f_{LO1}$ generated by first local oscillator 304 to form an RF signal of the sum frequency $f_{LO1}+f_{LO2}$ and an RF signal of the difference frequency $f_{LO1}-f_{LO2}$. Either one of these two RF signals is selected as a desired wave, and the other is an unnecessary image signal. Here, the RF signal of the sum frequency $f_{LO1}+f_{LO2}$ is taken as a desired wave, but the RF signal of the difference frequency $f_{LO1}-f_{LO2}$ may be taken as a desired wave. The image signal is eliminated by the filter 108 for image removal comprising BPF. The desired wave is amplified to the required power level by a power amplifier 109, after which it is supplied to an antenna 307 through a transmission/receiving selection switch (or duplexer) 306, and irradiated as electric wave.

On the other hand, in the receiving system, a receiving RF signal outputted from the antenna 307 is inputted to a low noise amplifier (LNA) 202 through the transmission/receiving selection switch (or duplexer) 306 and a filter 201 comprising BPF. The receiving RF signal amplified by the LNA 202 is inputted to a down converter 204 through an image removing filter 203 comprising BPF.

The down converter 204 performs multiplication of the received RF signal with the first local oscillation signal of the frequency $f_{LO1}$ generated by the first local oscillator 304 to make frequency conversion of the received RF signal into IF signal. This IF signal passes through the filter 205 comprising BPF, after which it is inputted to the orthogonal demodulator comprising a wave divider (not illustrated) and a multipliers 207 and 208 through a variable gain circuit 206.

Here, the variable gain circuit 206 is a variable gain circuit based on the present invention as described so far, in the same manner as the variable gain circuit 105 on the transmission side, and it adjusts the IF signal inputted according to the gain control signal from the non-illustrated control system (corresponding to the gain control signal Vx) to a moderate signal level. In case the voltage signal is required as an output of the variable gain circuit 206, a current signal is converted to a voltage signal and outputted.

To the above orthogonal demodulator, in the same manner as in the orthogonal modulator on the transmission side, the second local oscillation signals of the frequency $f_{LO2}$ set in orthogonal relation through 90 degree phase shifter 303 is inputted from the second local oscillator 301, in the same manner as in the orthogonal modulator on the transmission side. These outputs Ich (RX) and Qch (RX) of the orthogonal demodulator are inputted to a base band processing unit 209 on the receiving side, wherein the received signal is demodulated, by which the original base band signal is reproduced.

In this application example, it has been stated that the present invention is to be applied to the variable gain circuits 105 and 206 of IF stage, but the constitution of the variable gain circuit of the present invention is applicable to the case of constituting the transmission side power amplifier 109 or the receiving side LNA 202 which are high frequency circuits by the variable gain circuit. In these cases, the difference is basically in the only change of the input signal to RF signal from IF signal.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the specific constitution of the variable gain amplifier 12 or the gain control signal correction circuit 11 is not limited to the illustrated example.

As described above, according to the present invention, there is provided a gain control signal correction circuit for correcting the gain control signal set to vary in linear form to the gain in decibel expression in a manner to compensate for degradation of the amplification characteristic of the variable gain amplifier, and the gain control signal after correction is inputted to the variable gain amplifier. Accordingly, it is possible to expand the control voltage range of the gain control signal in which the gain varies in exponential function to the gain control signal before correction.

Furthermore, as it does not occur that the signal current is wasted in the variable gain amplifier, it becomes possible to maintain the S/N ratio of signal to a high level.

What is claimed is:

1. A variable gain circuit comprising:

a gain control signal correction circuit configured to correct a gain control signal Vx which varies linearly to a gain in decibel expression to obtain a corrected gain control signal Vy as follows:

$$Vy = Vt \times ln\{exp(b \times Vx/Vt) - 1\}$$

where, Vt is a thermal voltage, and $b \geq 0$; and a gain control circuit, configured to control a gain of an input signal according to the corrected gain control signal Vy, having a following gain:

$$Ia/I_{sig} = 1/[1 + exp(Vy/Vt)]$$

where $I_{sig}$ is an input signal current, and Ia is an output signal current.

2. The variable gain circuit according to claim 1, wherein said gain control signal correction circuit comprises:

a differential pair of first and second transistors, wherein a collector and a base of said first transistor are connected, a base of said second transistor is fixed to a predetermined direct current level, and a voltage between the bases of said first and second transistors is the corrected gain control signal;

a first current source connected to a common emitter of said first and second transistors; and a second current source connected to a collector of said first transistor, a current of said second current source being:

$$I_0 \times exp(-b \times Vx/Vt)$$

where $I_0$ is a current of said first current source, and b is a positive constant.

3. The variable gain circuit according to claim 2, wherein said gain control signal correction circuit comprises a current source for compensating for a base current connected to the base of said first transistor.

4. The variable gain circuit according to claim 1, wherein said gain control signal correction circuit comprises:

a differential pair of first and second transistors, wherein a collector and a base of said first transistor are connected, and a base of said second transistor is fixed to a predetermined direct current level, and a voltage between the bases of said first and second transistors is the corrected gain control signal;

a third transistor in which a collector is connected to a common emitter of said first and second transistors, a predetermined bias voltage is applied to a point between a base and an emitter, and a collector current is $I_0$;

a resistor of which one end is connected to the base of said third transistor;

a fourth transistor of which base is connected to the other end of the resistor;

a current source which is connected to the base of said fourth transistor, and outputs a current proportional to the gain control signal; and a current mirror circuit wherein a current input terminal is connected to a collector of said fourth transistor, which outputs a current of $I_0 \times exp(-b \times Vx/Vt)$ from a current output terminal to supply it to the collector of said first transistor.

5. The variable gain circuit according to claim 4, wherein said current mirror circuit outputs a current smaller than an input current.

6. The variable gain circuit according to claim 5, wherein said current mirror circuit comprises a fifth transistor connected to said fourth transistor and a sixth transistor connected to said first transistor, an emitter area of said fifth transistor being larger than an emitter area of said sixth transistor.

7. The variable gain circuit according to claim 5, wherein said current mirror circuit comprises a fifth transistor connected to said fourth transistor and a sixth transistor connected to said first transistor, a resistance connected to an emitter of said fifth transistor being smaller than a resistance connected to an emitter of said sixth transistor.

8. The variable gain circuit according to claim 1, wherein said gain control signal correction circuit comprises:

a differential pair of first and second transistors, wherein a collector and a base of said first transistor are connected, and a base of said second transistor is fixed to a predetermined direct current level, and a voltage between the bases of said first and second transistors is the corrected gain control signal;

a third transistor in which a collector is connected to a common emitter of said first and second transistors, a predetermined bias voltage is applied to a point between a base and an emitter, and a collector current is IO;

a resistor to which one end is connected to the base of said third transistor;

a fourth transistor of which base is connected to the other end of the resistor;

a current source which is connected to the base of said fourth transistor, and outputs a current proportional to the gain control signal;

a fifth transistor of which emitter is connected to a collector of said fourth transistor;

a first current mirror circuit wherein a current input terminal is connected to a collector of said fifth transistor, which outputs a current of $I_0 \times exp(-b \times Vx/Vt)$ from a current output terminal to supply it to a collector of said first transistor; and a second current mirror circuit wherein a current input terminal is connected to a base of said fifth transistor, and a current output terminal is connected to the base of said first transistor.

9. The variable gain circuit according to claim 8, wherein said second current mirror circuit comprises a seventh transistor connected to said fifth transistor and an eighth transistor connected to said first transistor, an emitter area of said eighth transistor being larger than an emitter area of said seventh transistor by n times, where n satisfies a following equation:

a direct current component of the input signal current of said gain control circuit=(n−1)×$I_0$.

10. The variable gain circuit according to claim 8, wherein said second current mirror circuit comprises a seventh transistor connected to said fifth transistor and an eighth transistor connected to said first transistor, a resistance connected to an emitter of said seventh transistor being larger than a resistance connected to an emitter of said eighth transistor by n times, where n satisfies a following equation:

a direct current component of the input signal current of said gain control circuit=(n−1)×$I_0$.

11. A wireless transmission circuit comprising:

a frequency modulator configured to convert a transmission base band signal to an intermediate frequency signal by using a first local oscillation signal;

a variable gain circuit according to claim 1 configured to adjust a level of the intermediate frequency signal;

a filter configured to eliminate unnecessary harmonics contained in an output of said variable gain circuit; and a frequency converter configured to convert an output of said filter to a radio frequency signal by using a second local oscillation signal.

12. A wireless reception circuit comprising:

a frequency converter configured to convert a reception radio frequency signal to an intermediate frequency signal by using a first local oscillation signal;

a filter configured to eliminate unnecessary harmonics contained in the intermediate frequency signal output from said frequency converter;

a variable gain circuit according to claim 1 configured to adjust a level of the intermediate frequency signal output from said filter; and a frequency modulator configured to convert to the intermediate frequency signal output from said variable gain circuit to a reception base band signal by using a second local oscillation signal.

13. A variable gain circuit comprising:

a gain control signal correction circuit configured to correct a gain control signal Vx which varies linearly to a gain in decibel expression to obtain a corrected gain control signal Vy as follows:

$$Vy=Vt \times ln\{\exp(b \times Vx/Vt)-1\}$$

where, Vt is a thermal voltage, and b≧0 ; and a gain control circuit, configured to control a gain of an input signal according to the corrected gain control signal Vy, comprising a differential pair of first and second transistors in which an input signal current is inputted to a common emitter of said first and second transistors, the corrected gain control signal is supplied to a point between bases of said first and second transistors, and an output signal current is taken out from a collector of said first transistor.

14. A variable gain circuit comprising:

a gain control signal correction circuit configured to correct a gain control signal Vx which varies linearly to a gain in decibel expression to obtain a corrected gain control signal Vy as follows:

$$Vy=Vt \times ln\{\exp(b \times Vx/Vt)-1\}$$

where, Vt is a thermal voltage, and b≧0; and a gain control circuit, configured to control a gain of an input signal according to the corrected gain control signal Vy, comprising a first differential pair of first and second transistors in which a positive input signal current is inputted to a common emitter of said first and second transistors, the corrected gain control signal is supplied to a point between bases of said first and second transistors, and a positive output signal current is taken out from a collector of said first transistor; and a second differential pair of third and fourth transistors in which a negative input signal current is inputted to a common emitter of said third and fourth transistors, the corrected gain control signal is supplied to a point between bases of said third and fourth transistors, and a negative output signal current is taken out from a collector of said third transistor.

* * * * *